United States Patent [19]
Hosier et al.

[11] Patent Number: 5,909,041
[45] Date of Patent: *Jun. 1, 1999

[54] PHOTOGATE SENSOR WITH IMPROVED RESPONSIVITY

[75] Inventors: Paul A. Hosier, Rochester; Jagdish C. Tandon, Fairport; Scott L. Tewinkle, Ontario, all of N.Y.

[73] Assignee: Xerox Corporation, Stamford, Conn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/976,273

[22] Filed: Nov. 21, 1997

[51] Int. Cl.⁶ .................. H01L 31/062; H01L 31/113
[52] U.S. Cl. ................ 257/292; 257/233; 257/290; 257/291
[58] Field of Search .................. 257/215, 216, 257/222, 249, 233, 291, 292

[56] References Cited

U.S. PATENT DOCUMENTS

| | | | |
|---|---|---|---|
| 5,187,380 | 2/1993 | Michon et al. | 257/428 |
| 5,471,515 | 11/1995 | Fossum et al. | 377/60 |
| 5,488,251 | 1/1996 | Mizutani et al. | 257/557 |
| 5,576,763 | 11/1996 | Ackland et al. | 348/308 |
| 5,587,596 | 12/1996 | Chi et al. | 257/223 |
| 5,625,210 | 4/1997 | Lee et al. | 257/292 |
| 5,631,704 | 5/1997 | Dickinson et al. | 348/308 |

FOREIGN PATENT DOCUMENTS

| | | |
|---|---|---|
| A2-757390 | 12/1997 | European Pat. Off. . |
| A2-57-92877 | 6/1982 | Japan . |

*Primary Examiner*—Carl Whitehead, Jr.
*Assistant Examiner*—Jesse A. Fenty
*Attorney, Agent, or Firm*—R. Hutter

[57] ABSTRACT

A depleted-gate photosensor, or photogate, structure includes a polysilicon layer disposed over a silicon substrate. The polysilicon layer occupies only a portion of each exposure area of the substrate, and is preferably in the form of a ring around the exposure area. By having a portion of the exposure area not covered by the polysilicon, the blue-light-attenuation effects of a polysilicon layer are reduced.

6 Claims, 3 Drawing Sheets

PHOTOGATE SENSOR WITH IMPROVED RESPONSIVITY

FIELD OF THE INVENTION

The present invention relates to CMOS active pixel image sensors, also known as depleted-gate photosensors, or simply photogates.

BACKGROUND OF THE INVENTION

Currently there are two prevalent basic technologies for image sensing with solid-state apparatus, such as in a television camera or document scanner: the charge-coupled device, or CCD, and CMOS. These two technologies have respective practical advantages and disadvantages. Recently, however, there has become available a new sensor technology which is intended to preserve the advantages of either CCDs or CMOS. This technology is known as "CMOS active pixel image sensors" or "depleted-gate photosensors," or most simply "photogates." In brief, a small single-stage CCD is fabricated for each photosensor, and the output of the single CCD stage is integrated with CMOS circuitry, such as a transfer circuit. The basic technology of constructing such photogates is disclosed in Mendis, Kemeny, and Fossum, "CMOS Active Pixel Image Sensor," IEEE Transactions on Electron Devices, Volume 41, No. 3, March 1994.

The basic structure of a photogate-based photosensor is as follows. There is disposed in a silicon structure one externally-biased area with an exposed surface, known as a photogate, which accepts light thereon. When the photogate is exposed to light, a charge is created in the depletion layer thereof. A transfer gate is disposed next to the photogate. When it is desired to transfer the charge from the photogate, a potential is applied to the transfer gate, thus deepening the potential well there. This deepening of the potential well in the transfer gate causes the charge in the photogate to spill into the transfer gate, according to the basic CCD method. This CCD-type charge transfer occurs only once in the process, and the charge spilled into the transfer gate is converted into a voltage with associated CMOS circuitry.

Although photogates have numerous advantages, such as small size, CMOS-compatibility and relative ease of fabrication, certain problems must still be addressed in order to incorporate this technology in, for example, a full-color document scanner. In one type of full-color document scanner, there are provided three separate linear arrays, each array incorporating a relatively large number of photosensors. Each separate linear array of photosensors is filtered with one primary color filter, such as red, blue, and green. The three primary-color-filter linear arrays are then exposed to an original document moving past, to record video signals based on the exposed document. Because each individual linear array is filtered with one primary color, the ultimate output is three color separations based on the original image.

One particular practical problem associated with photogates that has been observed is difficulty in absorbing short wavelengths of light, particularly blue light. Because short-wavelength light tends to be attenuated by a polysilicon overlayer which is common in photogates, it tends not to penetrate into the monocrystalline silicon where the electron-hole pairs are generated. A clear example of this deficiency in photogates is shown in European patent application EP-A2-757390. In this reference, a full-color cell is designed, with photogates used for receiving red and green light; however, the blue light is intended to be detected not by a photogate but by a separate photodiode. The fundamental design of this cell shows that there is a need in the prior art for a photogate design which is particularly useful in detecting short wavelengths of light.

DESCRIPTION OF THE PRIOR ART

In the prior art, the article "CMOS Active Pixel Image Sensor," referenced above, sets forth the basis operating principle of photogates.

U.S. Pat. No. 5,471,515 discloses a monolithic CMOS integrated circuit including a focal plane array of pixel cells, each one of the cells including a photogate, a readout circuit including at least an output field effect transistor, and a charge coupled device adjacent the photogate. Each photogate has associated therewith at least one charge coupled device stage for transferring charge from the underlying portion of a substrate to a sensing node.

U.S. Pat. No. 5,576,763 discloses an active pixel sensor comprising a photosite for generating and storing charge carriers, a transfer transistor and output and reset electronics. The gate of the transfer transistor and the photogate are defined in a single layer of polysilicon. By virtue of its unique structure, the device can operate without a clock or associated driving circuitry.

U.S. Pat. No. 5,587,596 discloses an active pixel sensor cell wherein a single MOS transistor is formed in a well to perform the functions conventionally performed by a photogate/photodiode, sense transistor and access transistor. Light energy striking the well varies the potential of the well which, in turn, varies the threshold voltage of the transistor. As a result, the current sourced by the transistor is proportional to the received light energy.

U.S. Pat. No. 5,625,210 discloses a photosensor device in which photodiodes are fabricated with CCD process steps and integrated into an active pixel architecture.

U.S. Pat. No. 5,631,704 discloses an active pixel imaging system which generates a differential output signal based on the differences in a viewed image between adjacent detected frames. When a particular pixel sensor is activated it generates a voltage signal corresponding to a previous frame's detected light intensity before the pixel is reset, thereby generating a voltage signal corresponding to a present frame's detected light intensity. Dickinson et al., "A 256× 256 CMOS Active Pixel Image Sensor With Motion Detection," 1995 IEEE International Solid-State Circuits Conference, paper TP 13.5, discloses a similar system.

U.S. Pat. No. 5,187,380 discloses a radiation detector comprising a monocrystalline silicon substrate doped to N type conductivity, with a more lightly doped N type conductivity epitaxial layer formed on the substrate. A patterned region of the epitaxial layer is heavily doped to a P type conductivity, and is in the shape of parallel stripes. The parallel stripes are spaced apart from each other by a distance smaller than the minority charge carrier recombination diffusion length for the epitaxial layer. The stripes are used as a collection region for charge generated in the epitaxial layer, while also minimizing the capacitance associated with the radiation detector.

European Patent Application EP-A2-757390 discloses an active pixel image sensor for full-color images, in which each pixel cell of the array includes two photogates, to receive red and green light respectively, and a CMOS-type photodiode for receiving blue light. This reference is described in detail above, as illustrating a need in the prior art a photogate which can receive short-wavelength light, such as blue light.

Japanese kokai JP-A2-57-92877 discloses a photodiode in which a circular P layer is formed on an N type substrate, with aluminum electrodes attached to the circular layer. The inner diameter of a circular P layer is determined to be twice the length of a diffusion length of a minority carrier and more than twice a spreading width of a depletion layer. The overall purpose is the cause the circular P layer to act as a charge collector while minimizing the overall capacitance of the photodiode.

SUMMARY OF THE INVENTION

According to one aspect of the present invention, there is provided a depleted-gate photosensor, comprising a substrate comprising crystalline silicon, the substrate defining a main surface including an exposure area exposable to light. An oxide layer is disposed adjacent the main surface of the substrate, the oxide layer defining a gap of non-oxide material in the main surface of the substrate, and including oxide immediately adjacent the gap within the exposure area. A polysilicon layer is disposed on the main surface, the polysilicon layer substantially covering the gap and extending over a portion of the exposure area and over a portion of the oxide layer immediately outside the gap.

BRIEF DESCRIPTION OF THE DRAWINGS

FIG. 1 is a plan view of the structure of a photosensor and transfer gate according to the invention; while

DETAILED DESCRIPTION OF THE INVENTION

Figure 1A:
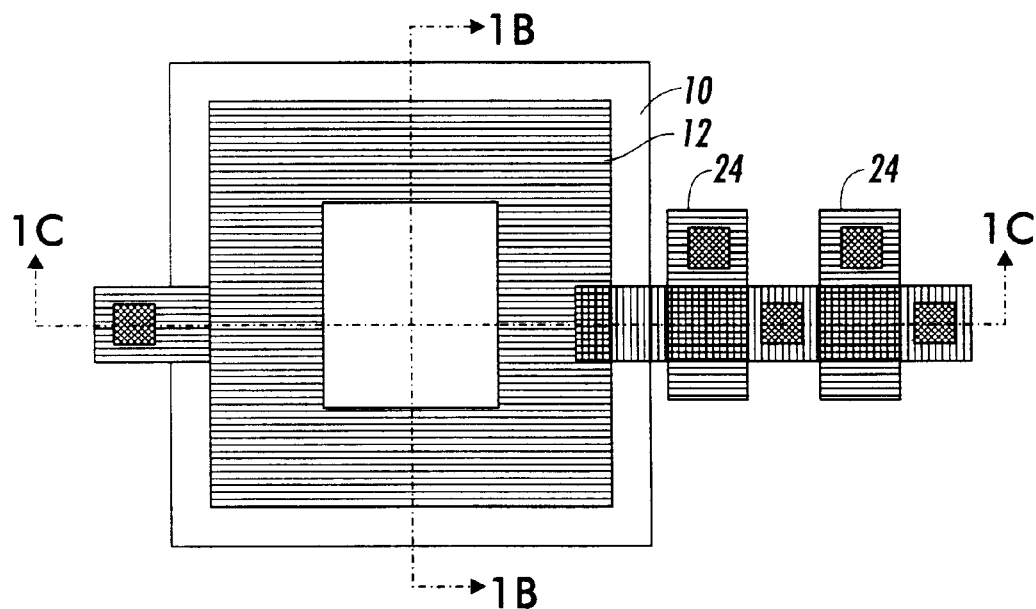
Figure 1B:
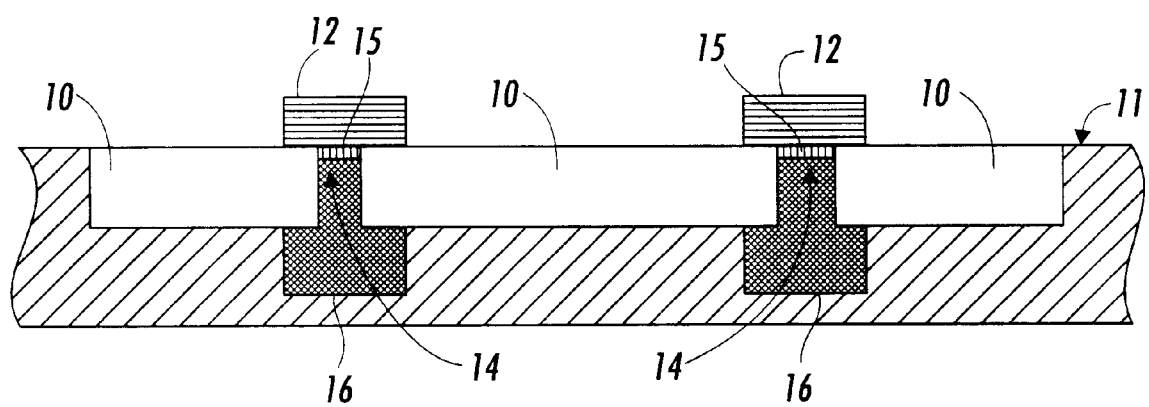
FIG. 1B is a sectional elevational view through the line marked 1B in FIG. 1A.
Figure 1C:
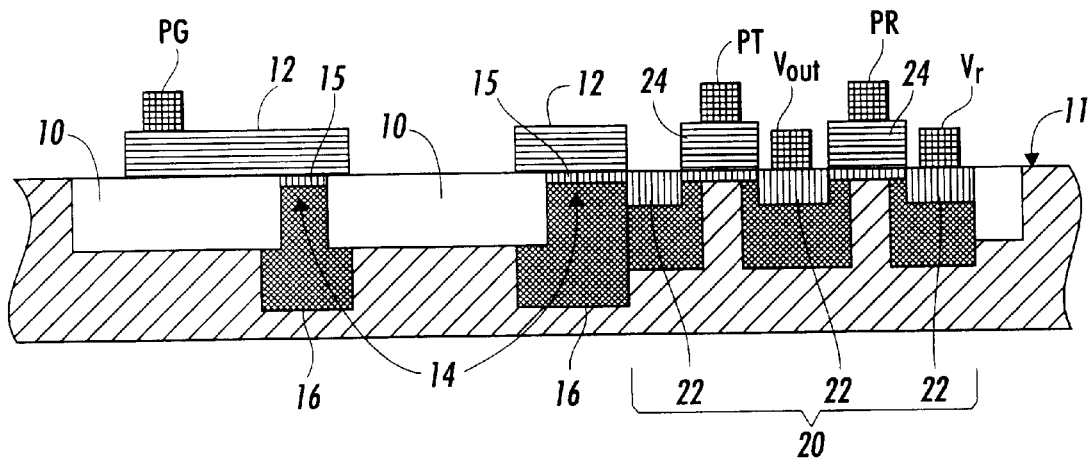
FIG. 1C is a sectional elevational view through the line marked 1C in FIG. 1A.

FIGS. 1A–1C are various plan and sectional elevational views of a single photogate, with associated transfer gate, according to one embodiment of the present invention. In the various Figures, like numerals indicate like elements. The bulk of the photosensitive surface of the photogate is in the form of a layer of a field oxide indicated as 10, defined on a main surface of a silicon substrate, such as shown as 11 in FIGS. 1B and 1C. (The various cross-hatches in the Figures are meant only to distinguish different indicated elements, and, in FIG. 1A, to show the overlapping of different elements in the plan view; the materials used for the different elements are described in the text herein.) The borders of the photosensitive region, or exposure area, can be formed by an opaque light shield (not shown) formed around the borders of field oxide 10. Disposed generally over the area of field oxide 10 is a layer of polysilicon indicated as 12. Significantly, the layer of polysilicon 12 does not completely cover the exposure area formed by field oxide 10: in a preferred embodiment shown in the Figures, in plan view the polysilicon layer 12 is generally in the form of an enclosed area within the exposure area, such as a square with a square opening in the middle thereof, as shown, although other possible shapes, such as an X-shape or a non-enclosed U-shape, are possible.

It is important that polysilicon layer 12 cover only a portion of the area defined by field oxide 10. Polysilicon has an effect of attenuating short-wavelength (i.e., blue) light passing therethrough; thus the polysilicon layer 12 will tend to prevent blue light from an image being recorded from reaching the substrate 11. For this reason, by having the polysilicon layer 12 cover only a portion of the total exposure area, blue light will be able to penetrate the substrate 11 and create electron-hole pairs therein.

With particular reference to FIG. 1B, it can be seen that there is provided within the field oxide 10 a gap, indicated in two parts as 14, which generally follows the general shape of the polysilicon layer 12. In other words, whereas polysilicon layer 12 extends around a subset of the area defined by field oxide 10, the gap 14 is generally disposed directly under polysilicon layer 12. However, significantly, a portion of the polysilicon layer 12 extends beyond the edges of gap 14 and partially overlaps a portion of field oxide 10 on either side of gap 14. There is further disposed a relatively thin (about 180 Angstroms) protection layer of field oxide, here called gate oxide 15, between the gap 14 and the polysilicon layer 12. When the apparatus shown in the Figures is functioning, polysilicon layer 12 interacts with the gate oxide 15 in gap 14 to form a depletion region 16 in the substrate 11.

The overall function of the device such as shown in FIG. 2B is as follows. Light impinging on the exposure area, that is, light coming from the top of the Figure, passes through the field oxide 10 and creates electron-hole pairs in the structure of substrate 11. Once again, because polysilicon layer 12 only covers a relatively small portion of the total exposure area, the effect of polysilicon layer 12 in blocking blue light is minimized. However, of course, some polysilicon layer 12 must be provided in order to collect charge created by the electron-hole pairs in substrate 11. The geometry of the polysilicon layer 12 covering a portion of the exposure area is generally selected with regard to a diffusion length of the substrate 11 so that charge created at any particular point in the exposure area is likely to migrate toward a gap 14 where it can be collected by the depleted gate region under polysilicon layer 12.

With respect to the gap 14 in detail, what is essentially created at the interface between the silicon in gap 14 and polysilicon layer 12 is a small N-channel transistor gate, with the exception that there are no source or drain. However, there is defined, particularly at gate oxide 15, a threshold behavior. Preferably, this threshold behavior should correspond to an operating range at which the overall device can output light-based image signal charges. For example, if the desired operating range of potentials for the overall device is from 0 to 5 volts, a good threshold formed at the gate oxide 15 is about 0.7 volts. In contrast, the much thicker areas of field oxide in the bulk of field oxide 10 will have a threshold well beyond the operating range, such as 15 volts. Thus, the interface between the substrate 11 and polysilicon layer 12 at gap 14 forms the "photogate" or depleted-gate photosensor.

A typical depth of the oxide layer 11 is about 0.3 microns, and a typical depth of the polysilicon layer 12 is also about 0.3 microns. A typical overall width of a single photosensitive exposure area such as would be used in a 400 sensor-per-inch image scanning array would be approximately 50×60 microns.

The overall structure shown in the Figures is that of a photogate with associated transfer gate. With particular reference to FIG. 1C, it will be seen that one portion of the gap 15 which is adjacent a transfer circuit generally indicated as 20, extends toward a series of N+ diffusions 22 which are interspaced with layers of polysilicon indicated as 24. It can be seen that the various N+ diffusions and adjacent polysilicon layers 24 are provided with metal electrodes, each metal electrode having a particular identified input thereto. The letter indications PG, PT, PR, $V_{out}$, and $V_r$ represent locations upon which signal charges may be placed in a specific order in order to read out a signal created within substrate 11 to be read out through the transfer gate generally indicated as 20.

Figure 2:
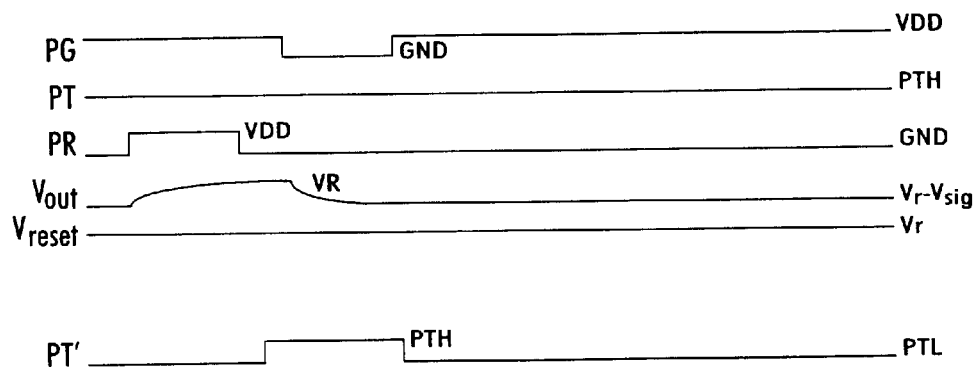
FIG. 2, is a timing diagram showing the application of potentials to different portions of the photosensor according to the present invention in order to read out a signal-based charge therefrom.

FIG. 2 is a comparative timing diagram illustrating the sequence of signals to be placed on the various indicated electrodes in order to read out a signal created by light impinging on the field oxide 10 through the transfer circuit 20. In FIG. 2 there are shown two variants of the signal that can be placed on PT, with PT' being a preferred signal to be placed on PT if the signal from a particular field oxide is to be multiplexed with other image signals. In brief, initially a potential VDD is placed on the photogate PG formed by the combination of polysilicon layer 12 with field oxide 10. The initial potential on polysilicon layer 12 creates a potential well under polysilicon layer 12. In order to read out a particular charge from polysilicon layer 12, as is generally known in the art of depleted-gate photosensors, the potential on transfer gate PT must be momentarily made higher than that in photogate PG. Thus, at read out time the potential on photogate PG is momentarily dropped to ground while (in the case of PT) the potential on transfer gate PT remains constant or (in the case of PT') is momentarily raised to a relatively high level PTH from a relatively low level PTL just before and just after the momentary drop in potential on the photogate PG.

The effect of this momentary change in potential between PG and PT is to draw any charge accumulated on polysilicon layer 12 (ultimately from the effect of light on substrate 11) from the polysilicon layer 12 to transfer gate 20. The signal that is ultimately read out of the photogate appears as a voltage on $V_{out}$, where it may be connected ultimately to CMOS image-processing circuitry. Also shown in FIG. 2 is a reset gate voltage PR which, when momentarily activated with a voltage VDD, causes a relatively high reset voltage $V_r$ to be loaded onto $V_{out}$. The purpose of this is to "clear" the transfer gate 20 from any potential related to the reading out of prior signals, so that a uniform dark level will be established for the transfer gate. The signal output $V_{sig}$, which will relate to the light intensity on the photogate, appears on $V_{out}$ as a value related to reset voltage $V_r$ minus $V_{sig}$, as shown.

Figure 3:
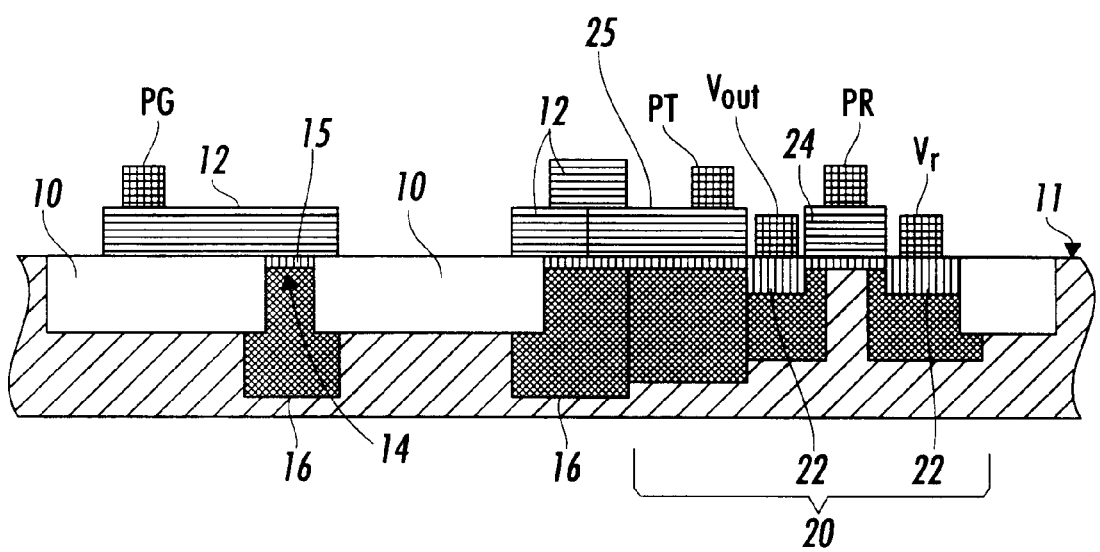
FIG. 3 is a sectional elevational view, similar to FIG. 1C, of an alternate embodiment of a photosensor and transfer gate according to the present invention.

It will be apparent that the structures for the transfer gate 20 such as nodes for transfer voltage PT and reset voltage PR, can be formed in the same layering step in which, for example, polysilicon layer 12 is formed. However, FIG. 3 is a sectional elevational view of an alternate embodiment of the present invention, which differs from the structure shown in FIG. 1C in that the node for transfer voltage PT is formed not in the same layer of polysilicon as polysilicon layer 12, but is rather formed in a separate polysilicon layer which is directly connected to polysilicon layer 12. This distinct polysilicon layer, indicated as 25, is preferably formed in a separate layering step than polysilicon layer 12, and should provide a thin layer of oxide (not shown) at the interface between layer 25 and polysilicon layer 12, so that the two layers are not permanently shorted. The advantage of the structure of FIG. 3 is that, in operation, no residual charge will be left on the field oxide layer 12 when there is a change in relative potentials between PG (that is field oxide layer 12) and PT (layer 25).

Although the preferred embodiment of the invention, such as shown in FIG. 1A discloses a "doughnut" shaped field oxide layer which indeed serves as a charge collection layer, the overall structure of the present invention differs in significant ways from generally similar doughnut structures applied to, for example, CCD stages or CMOS photodiodes. First, the general doughnut structure of a charge collection layer would be inefficient in a multi-stage CCD which is common in the art of solid-state scanning devices, because such a doughnut shaped collection layer would be a mere source of inefficiency in collecting charge from a CCD stage.

In U.S. Pat. No. 5,187,380 and JP-A2-5792877, a doughnut structure exists in a CMOS photodiode or radiation detector. In both of these cases, the overall purpose of the doughnut structure is to lower the overall capacitance of the photosensor. In the case of CMOS photosensors, the ultimate output is a signal in the form of a potential, which in turn is transferred to a zone of lower potential to read out of the photosensor. In such a case, it is therefore desirable to minimize the capacitance of the photosensor itself, because the capacitance of the photosensor is an unpredictable source of noise. However, the present invention is directed to a depleted-gate photosensor, or photogate, and the ultimate output of such a photogate (that is, what is output from polysilicon layer 12) is not in the form of a potential, but in the form of a charge. During a read out spill, such as when PG and PT change relative polarities, all of the free charge which is generated within the exposure area of substrate 11 is flushed out; as the amount of charge transferred out is not voltage dependent, the charge will not be effected by the voltage on the circuitry into which the charge is transferred. Thus, the concern with junction capacitance which is important in photodiodes is a completely different problem which is irrelevant to the function of a photogate. The main reason for the doughnut or other structure in the present invention is to avoid the blue-attenuation effects of the polysilicon layer which collects the charge.

Although the sectional views in the present disclosure show somewhat idealized sectional shapes of the various layers in the present invention, one of skill in the art will recognize that the general shapes of the layers shown, such as in FIGS. 1B and 1C are intended to show merely the desired configuration of such layers, and that a practical embodiment of the structure shown in FIG. 1B or 1C will have, for example, tapered edges on individual layers.

While the invention has been described with reference to the structure disclosed, it is not confined to the details set forth, but is intended to cover such modifications or changes as may come within the scope of the following claims.

We claim:

1. A depleted-gate photosensor, comprising:
   a substrate comprising continuously-doped, single-crystal silicon, the substrate defining a main surface including an exposure area exposable to light;
   an oxide layer disposed on the main surface of the substrate, the oxide layer defining a gap in the main surface of the substrate, the layer including oxide immediately adjacent the gap within the exposure areas, the gap being defined in only a portion of the exposure area;
   a polysilicon layer disposed on the main surface, the polysilicon layer substantially covering the gap and extending over a portion of the exposure area and over a portion of the oxide layer immediately outside the gap; and
   a gate oxide layer disposed between the substrate and the polysilicon layer within the gap.

2. The photosensor of claim 1, the gap configured to form an enclosed area in the exposure area in a portion of the main surface of the substrate.

3. The photosensor of claim 1, the substrate and polysilicon layer forming, at an interface thereof, a gate having a predetermined threshold voltage.

4. The photosensor of claim 1, further comprising a transfer gate connected to the oxide layer.

5. The photosensor of claim 4, wherein the transfer gate includes a second polysilicon layer disposed immediately adjacent the polysilicon layer of the photosensor.

6. The photosensor of claim 1, the polysilicon layer configured to form an enclosed area in the exposure area in a portion of the main surface of the substrate.

* * * * *